United States Patent [19]

Toyoda

[11] Patent Number: 5,572,210
[45] Date of Patent: Nov. 5, 1996

[54] DIGITAL SIGNAL PROCESSING APPARATUS

[75] Inventor: Takashi Toyoda, Tokyo, Japan

[73] Assignee: Sony Corporation, Tokyo, Japan

[21] Appl. No.: 218,382

[22] Filed: Mar. 25, 1994

[30] Foreign Application Priority Data

Mar. 26, 1993 [JP] Japan .................. 5-068351

[51] Int. Cl.$^6$ .................................. H03M 1/66
[52] U.S. Cl. ...................................... 341/144
[58] Field of Search .................... 341/144, 146, 341/154, 143, 145; 364/724.1, 724.2, 724.3, 724.4

[56] References Cited

U.S. PATENT DOCUMENTS

4,236,224  11/1980  Chang ........................ 364/724
5,057,840  10/1991  Ledzius et al. ................ 341/144

Primary Examiner—Brian K. Young
Attorney, Agent, or Firm—Pasquale Musacchio, Esq.; Jerry A. Miller; Karin L. Williams, Esq.

[57] ABSTRACT

An apparatus for operating a digital signal includes a digital filter, a rounding process unit, a rounding error detecting unit and a rounding error eliminating unit. The allowable input word length is (m) bits for the digital filter. For the input with (n) bits which is longer than the allowable input word length of (m) bits, the rounding process unit processes the rounding and supplies it to the digital filter. The rounding error detecting unit extracts the rounding error based on the (n) bits input signal and the output signal after the rounding process. Utilizing this rounding error detected by the rounding error detecting unit, the rounding error eliminating unit eliminates the rounding error which has been mixed with the filtering output signal of the digital filter.

12 Claims, 5 Drawing Sheets

(Prior Art)

(Prior Art)

DIGITAL SIGNAL PROCESSING APPARATUS

BACKGROUND

1. Field of the Invention

The present invention relates to an apparatus for processing a digital signal and its method. More particularly, the present invention relates to the apparatus and method for processing a digital signal, which avoids aliasing occurring during converting a digital signal into an analog signal.

2. Background of the Invention

In general, digital equipment such as compact disc (CD) players or digital audio tape (DAT) players use a D/A (digital do analog) converter to convert a digital audio signal readout from a recording medium into an analog audio signal as a reproducing output signal. The image components occur at both sides of a certain frequency that is the integral multiple of an original sampling frequency when the digital audio signal is converted into the analog audio signal. The image components contained aliasing interference. In such digital equipment, it is necessary to avoid aliasing when the digital audio signal is converted into the analog audio signal. It is possible to avoid aliasing by eliminating image components.

For example, in the CD players in early days, aliasing was avoided utilizing an analog low pass filter. However, the technology has been recently established for massproducing digital filters. The analog filter now becomes more expensive than digital one. In addition, the analog filter having a sharp filtering characteristics deteriorates the quality of the reproducing sound. Therefore, aliasing is presently avoided by use of a digital filter.

Figure 1:
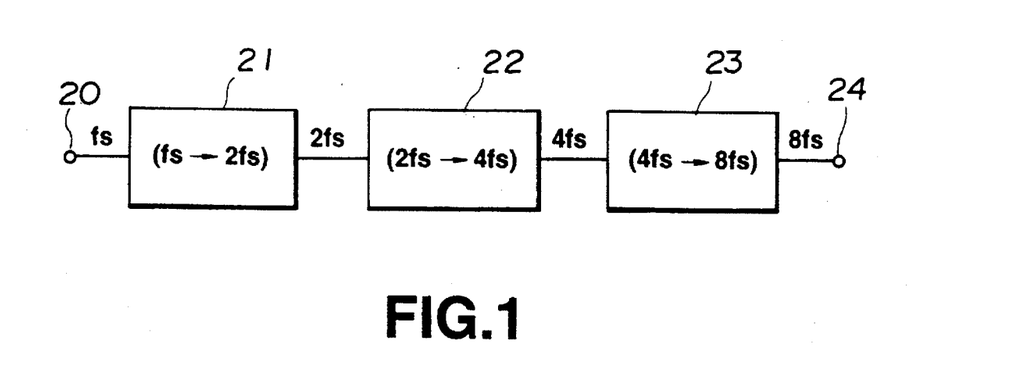
FIG. 1 shows a drawing to explain the summary of an apparatus for processing a digital signal with a step-by-step structure.

Most recently, the sampling frequency (fs) is converted into eight times sampling frequency (8fs) so that image components may be eliminated in the audio frequency band. It is aimed to perform enough suppression of components out of the band and also relax the specification of the analog filter after the D/A converter. The digital filter arrangement has been proposed to convert the sampling frequency (fs) into the eight times sampling frequency (8fs). As shown in FIG. 1, FIR (Finite Impulse Response) filters 21, 22 and 23 are connected in series. The FIR filter 21 converts the sampling frequency (fs) supplied from an input terminal 20 into (2fs). The FIR filter 22 converts the sampling frequency (2fs) into (4fs). The FIR filter 23 converts the sampling frequency (4fs) into (8fs). Consequently, the signal (8fs) is outputted from an output terminal 24. Rather than converting the sampling frequency (fs) into (8fs) at one step conversion process, the step-by-step conversion process as aforesaid is preferred due to better efficiency. The FIR filters 21, 22 and 23 have a linear phase.

The eight times sampling frequency is obtained by connecting three FIR filters in series. These FIR filters have linear phase and convert the sampling frequency of the input signal into a twice sampling frequency. As a result, it is possible to use the well-known technology that the number of operations can be reduced when the cut-off frequency is set to a half frequency of the Nyquist frequency. The hardware can be therefore simplified compared with converting the sampling frequency into the eight times one in a one step conversion process.

Three FIR filters are connected in series, each of which has the linear phase and converts the sampling frequency (fs) of the input signal into the twice one, to finally obtain the eight times sampling frequency. At this time, operations of addition and multiplication at each of FIR filters can be performed by a single operation part with time division processing.

Figure 2:
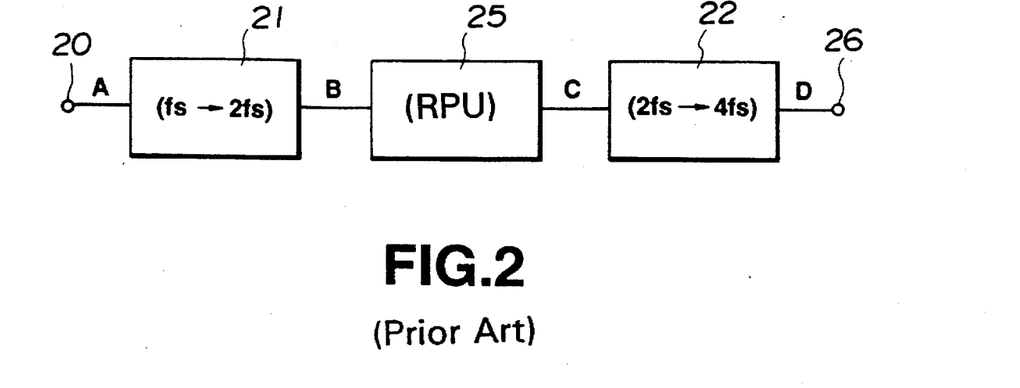
FIG. 2 shows a block diagram of a conventional apparatus for processing a digital signal.

As a result, the allowable input word length of each FIR filters become the same word length, and so does the output word length of each FIR filters. In general, the output word length becomes longer than the allowable input word length in the filtering process. As shown in FIG. 2, a rounding process unit 25 (RPU) is therefore connected between the FIR filter 21 and 22 shown in FIG. 1. The rounding process unit 25 converts the output word length of the FIR filter 21 rounded so that it can be suitable for the allowable word length of the FIR filter 22.

A rounding error which is generated during this rounding process is mixed with the output signal from the FIR filter 21. The output signal of the rounding process unit 25 is then filtered by the FIR filter 22 with the twice sampling frequency (4fs). The filtering output signal can be outputted through an output terminal 26.

Figure 3A:
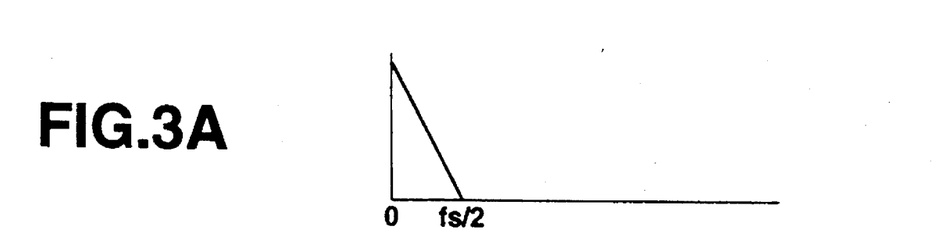
FIGS. 3A through 3D show signal spectrum of the locations A to D of the apparatus shown in FIG. 2.
Figure 3B:
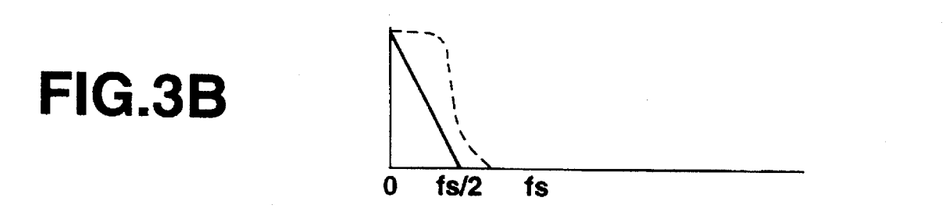
Figure 3C:
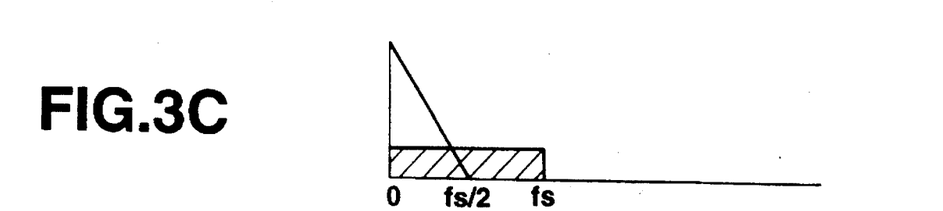
Figure 3D:
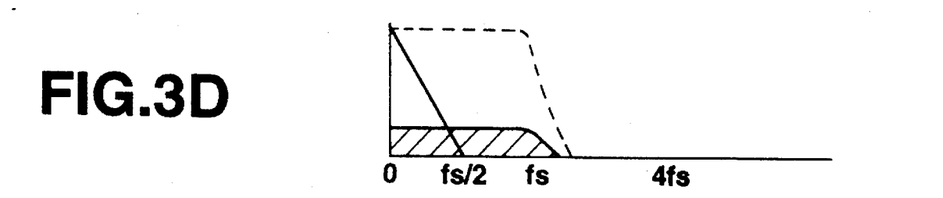

The spectrum of the signal at the locations A, B, C and D shown in FIG. 2 are shown and explained below with FIGS. 3A through 3D. The spectrum of the original signal shown in FIG. 3A is band-limited by the FIR filter 21 which has the filtering characteristics as shown by dotted lines in FIG. 3B. At this time, the sampling frequency of the original signal is converted into twice the sampling frequency by the FIR filter 21. Since the word length of the output signal outputted from the FIR filter 21 becomes longer than the word length of the input signal inputted in the FIR filter 21 in the general filtering process as explained, the limitation of the word length at the input stage of the FIR filter 22 may cause some problem. Therefore, the word length of the output data from the FIR filter 21 is rounded by the rounding process unit 25. The rounding error, i.e., the re-quantization error, is generated by the rounding process. The rounding error, there-quantization error, is mixed with the original signal as shown by hatched portion in FIG. 3C. The output signal of the rounding process unit 25 as shown in FIG. 3C has the word length within the allowable input word length of the FIR filter 22. The FIR filter 22 converts the sampling frequency into (4fs). Since the re-quantization error is mixed with the original signal as 25 described above, the original signal mixed with the re-quantization error is outputted through output terminal 26.

When the allowable input word length are all same in each FIR filters 21, 22 and 23 shown in FIG. 1, the input signal is limited to the word length at the input stage of the FIR filters 22 and 23. As a result, the output signal mixed with the rounding error is outputted from the output stage of the FIR filter 22 and 23, since the rounding error, the re-quantization error, occurred at the input stage of the FIR filter 22, 23.

The output signal mixed with the re-quantization error is not outputted, if each of FIR filters 21, 22 and 23 is constituted as independent operation elements. However, in this case, the digital signal operation apparatus becomes a more expensive apparatus.

It is also considered to convert the input word length to one shorter for the FIR filter 21 and 22 so that the re-quantization error may become small enough at the input stage of the FIR filter 23. However, this wastes the original ability of the FIR filters.

SUMMARY OF THE INVENTION

It is, therefore, an object of the present invention to provide an apparatus and a method for processing a digital signal which resolves the above-mentioned problem.

In one aspect of the present invention, an apparatus for processing a digital signal is provided with a digital filter, a rounding process unit, a rounding error detecting unit and a rounding error eliminating unit. The allowable input word length is (m) bits for the digital filter. For an input with (n) bits which is longer than the allowable input word length (m) bits, the rounding process unit makes it round and supplies it to the digital filter. The error detecting unit detects the rounding error based in the (n) bits input signal and the output signal after the rounding process. Utilizing this rounding error detected by the error detecting unit, the rounding error eliminating unit eliminates the rounding error which has been mixed with the filtering output signal of the digital filter.

In another aspect of the present invention, a method for processing a digital signal is provided. The method includes the steps of providing a rounding process to a filtering output signal of the first digital filter which generates (n) bits output word length longer than (m) bits of the allowable input word length; mixing a rounding error occurred during this rounding process with the (n) bits input signal; supplying the signal which is mixed by the rounding error to the second digital filter having (m) bits of the allowable input word length; generating a signal opposite in phase to the rounding error by subtracting the mixed signal with the rounding error from the (n) bits input signal; compensating amplitude and phase of the generated signal opposite in phase to the rounding error in accordance with the process by the second digital filter and adding this compensated signal and the filtering output signal of the second digital filter so as to generate an output signal.

In accordance with the present invention, the error detecting unit detects the rounding error generated during the rounding process by which the input with the word length (m) bits can be allowed for the process in the digital filter. Utilizing the detected rounding error eliminating unit eliminates the rounding error component which has been already mixed with the output signal of the digital filter. The structure of the hardware does not become large. The rounding error, in other words re-quantization error, can be reduced within the audio frequency band.

BRIEF DESCRIPTION OF THE DRAWINGS

FIGS. 6i through 6n shows signal spectrum of the locations (a) to (h) of the apparatus shown in FIG. 4.

DESCRIPTION OF THE INVENTION

Referring to the drawings, it will be explained an embodiment of an apparatus for processing a digital signal of the present invention. The embodiment relates to an apparatus for processing a digital signal which can reduce re-quantization error and applies to digital audio equipments such as compact disc players, digital audio tape players. In the embodiment, a sampling frequency (fs) is converted into an eight times sampling frequency (8fs) by an input stage of a D/A converter using a step-by-step conversion process when a digital signal is converted into an analog signal. As a result, in the embodiment, the re-quantization error is out of an audio frequency band and substantially reduced.

Figure 4:
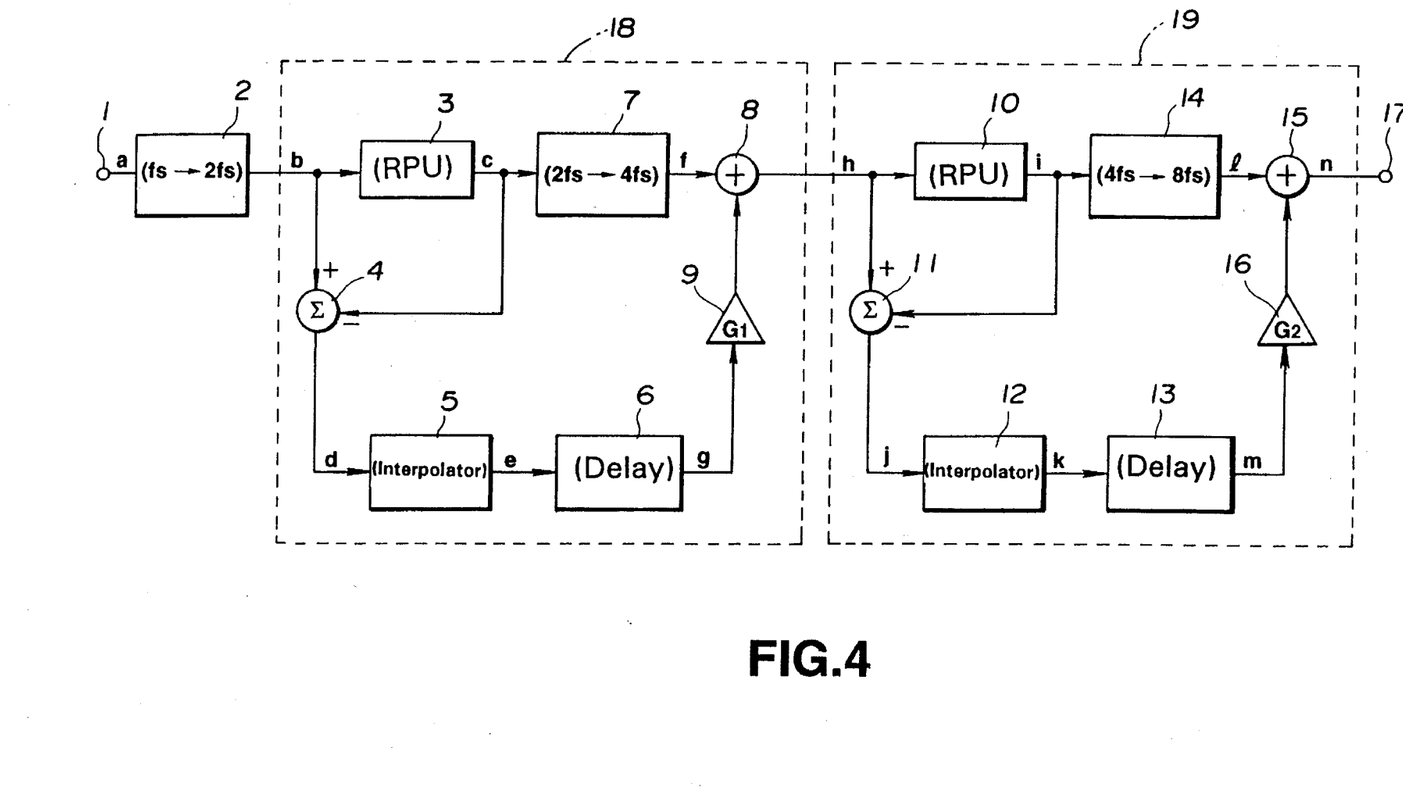
FIG. 4 shows a block diagram of an apparatus for processing a digital signal as an embodiment of the present invention.

Referring now to FIG. 4, the structure will be explained as the embodiment of the apparatus for processing a digital signal. In the embodiment, the apparatus for processing a digital signal has a block 18 and another block 19. The block 18 includes a FIR filter 7 with an input allowable input word length (m) bits, a rounding process unit (RPU) 3, a subtracter 4 and an adder 8. In FIG. 4, the rounding process is arranged so that an (n) bits input signal which is longer than the allowable input word length (m) bits can be processed by the FIR filter 7. The rounding process unit (RPU) 3 outputs the rounding error mixed with the (n) bits input signal, which is remainder component generated during the rounding process. The subtracter 4 extracts the rounding error, re-quantization error, from the output signal of the rounding process unit 3. The adder 8, utilizing the rounding error extracted by the subtracter 4, eliminates the rounding errorcomponent which has been mixed with the filtering output signal of the FIR filter 7.

The block 19 includes a FIR filter 14 with an allowable input word length (m) bits, a rounding process unit (RPU) 10, a subtracter 11 and an adder 15. The rounding process unit 10 performs the rounding process so that an (n) bits input signal which is longer than the allowable input word length (m) bits can be processed by the FIR filter 14. The rounding process unit outputs the rounding error mixed with the (n) bits input signal, which is remainder component occurred during the rounding process. The subtracter 11 extracts the rounding error, re-quantization error from the output signal from the rounding process unit 10. The adder 15, utilizing the rounding error extracted by the subtracter 11, eliminates the rounding error component which has been mixed with the filtering output signal from the FIR filter 14. The apparatus for operating a digital signal has the blocks 18 and 19 connected in series, and a further FIR filter 2 connected before the front stage of the block 18, which has an (n) bits output word length which is longer than the allowable input word length (m) bits.

The FIR filter 2 converts the sampling frequency (fs) of the supplied input signal into (2fs). The FIR filter 7 converts the sampling frequency (2fs) into (8fs). The FIR filter 14 converts the sampling frequency (4fs) into (8fs). These FIR filters 2, 7 and 14 have a linear phase. The operation of addition and multiplication at the FIR filter 2, 7 and 14 can be performed by single operation part with time division processing.

In interpolator 5, a delay circuit 6 and a multiplier 9 are connected between the subtracter 4 and the adder 8 in the block 10. The interpolator 5 converts the sampling frequency (2fs) of the rounding error outputted from the subtracter 4 into (4fs) to interpolate zero components between each of the sampled values. The signal outputted from the interpolator 5 is delayed by the delay circuit 6 to match the process of the FIR filter 7. The multiplier 9 corrects the effective amplitude of the output signal from the interpolator 5, in which the amplitude becomes a half amplitude after the interpolating process by the interpolator 5, to the effective amplitude of the signal pass band of the FIR filter 7.

An interpolator 12, a delay circuit 13 and a multiplier 16 are connected between the subtracter 11 and the adder 15 in the block 19. The interpolator 12 converts the sampling frequency of the rounding error outputted from the subtracter 11 into (8fs) to interpolate zero components between each of the sampled values. The output signal from the interpolator 12 is delayed by the delay circuit 13 to match the process by the FIR filter 14. The multiplier 16 corrects the effective amplitude of the signal through the delay circuit 13, in which the amplitude becomes a half amplitude after the interpolator 12, to the effective amplitude of the signal pass band of the FIR filter 14.

Figure 5A:
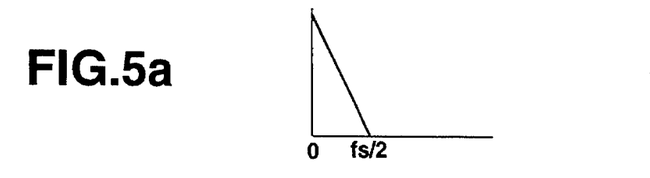
FIGS. 5a through 5h show signal spectrum of the locations (a) to (h) of the apparatus shown in FIG. 4.

Referring to FIG. 4 and FIGS. 5a through 5h and 6i through 6n, it will be explained the principle operation of the apparatus for operating a digital signal of this embodiment. FIG. 5a through FIG. 5h show the signals, in other words the spectrums according to the locations (a) through (h) shown in FIG. 4. FIG. 6i through FIG. 6n show the spectrums according to the locations (i) through (n) shown in FIG. 4. The principle operation of other block 18 will be explained as shown in FIG. 4. The original signal supplied via an input terminal 1 has a spectrum from (0) to (fs/2) because of the sampling frequency (fs) as shown in FIG. 5a. This original signal is converted from the sampling frequency into (2fs) and oversampled. As a result, the image components occurring at an integral number times of the sampling frequencyand up to the sampling frequency, is eliminated by the filtering characteristics shown by the broken line in FIG. 5b. The spectrum of the output signal from the FIR filter 2 shown in FIG. 5b becomes the spectrum in FIG. 5c after the rounding process by the rounding process unit 3. The process unit 3 performs this rounding process so that the (n) bits input signal which is longer than the allowable input word length of (m) bits can be accepted by the FIR filter 7 for processing. The rounding process unit 3 further mixes the (n) bits input signal with the rounding error which is the remainder component during the rounding process and outputs the mixed signal. The rounding conversion of the rounding process unit 3 substantially means the truncation of the rounding error. However, in practice, the rounding process adds rounding error to the (n) bits input signal. In other words, the rounding error is mixed with the (n) bits input signal.

Figure 5B:
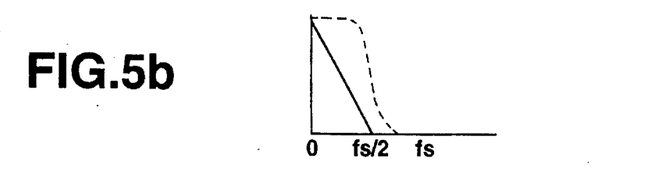
Figure 5C:
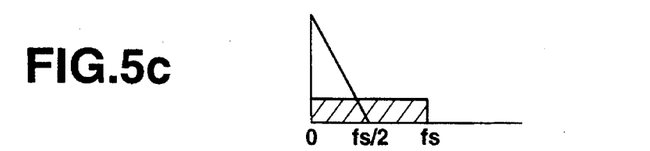
Figure 5D:
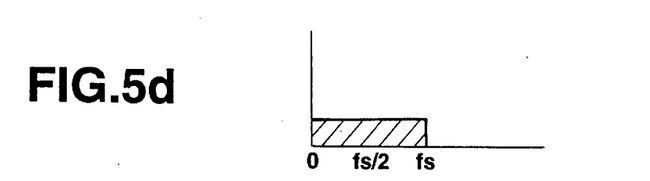
Figure 5E:
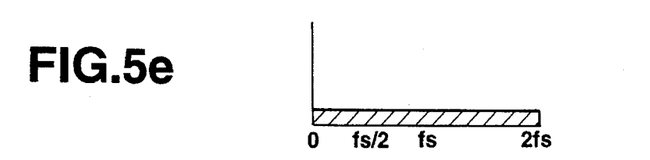

The signal having the spectrum shown in FIG. 5c and mixed with the rounding error is subtracted from the signal having the spectrum shown in FIG. 5b by the subtracter 4. Consequently, the original signal having the spectrum of (2) to (fs/2) is cancelled, and the rounding error having the spectrum shown in FIG. 5d remains. In fact, the rounding error shown in FIG. 5d is opposite in phase of the output signal from the rounding process unit 3. The rounding error shown in FIG. 5d is supplied to the interpolator 5. The rounding error is converted from the sampling frequency into (4fs) and the signal band pass into (2fs) by the interpolator 5. As a result, the rounding error is converted to the signal having the spectrum shown in FIG. 5e. This signal is supplied to the delay circuit 6 and delayed to match the process of the FIR filter 7. In other words, the output signal from the interpolator 5 is controlled in its output timing to match the output timing of the output signal from the FIR filter 7. Consequently, this signal outputted from the delay circuit converts the signal to one having the spectrum shown in FIG. 5g. FIGS. 5e and 5g show spectrums which are the interpolated and delayed the output signal from the subtracter 4.

The signal having the spectrum shown in FIG. 5g is then corrected by the multiplier 9 so that the electric power of the corrected signal can become equal to that of the rounding error included in the output signal of the FIR filter 7 at the band up to (fs). The corrected signal is supplied to the adder 8.

Figure 5F:
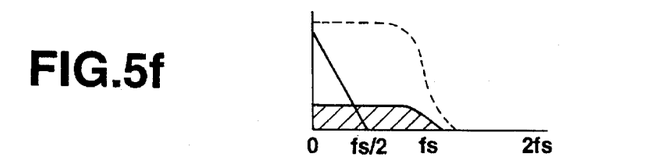
Figure 5G:
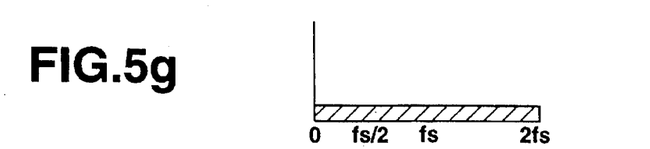

The adder 8 is also supplied the signal having the spectrum shown in FIG. 5f. The spectrum shown in FIG. 5f is a spectrum in which the input spectrum shown in FIG. 5c is converted from the sampling frequency (2fs) to (4fs) and is oversampled by the FIR filter 7. The adder 8 substantially subtracts from the spectrum shown in FIG. 5f the output signal of the multiplier 9, since the value according to the rounding error supplied from the multiplier 9 to the adder 8 is opposite in phase due to subtraction by the subtracter as described above. As a result, the adder 8 outputs the signal having the spectrum shown in FIG. 5h.

Figure 5H:
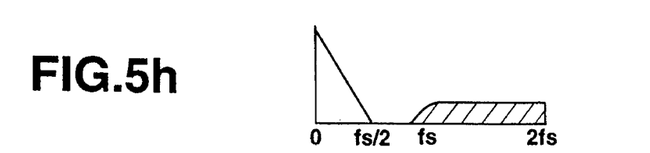

The signal having the spectrum shown in FIG. 5h cancels the rounding error mixed with the original signal in the audio frequency band. It has been explained as the original signal having the spectrum with (0) to (fs/2). The rounding error is now allowed to appear only around (fs) to (2fs) which is out of the audio frequency band.

The explanation is completed by the operation of the block 18 to eliminate the rounding error when the sampling frequency up to (4fs).

Next, the operation of the block 19 will be explained in FIG. 4. The spectrum shown in FIG. 5h is converted to the spectrum shown in FIG. 6i after the rounding process by the rounding process unit 10. The rounding process unit 10 performs this rounding process so that the (n) bits input signal which is longer than the allowable input word length of (m) bits can be accepted by the FIR filter for its process. The rounding process unit 10 mixes the (n) bits input signal with the rounding error which is the remainder component during the rounding process and outputs the mixed signal. The rounding conversion at the rounding process unit 10 substantially means the truncation of the rounding error. However, in practice, the rounding error is added to the (n) bits input signal by the rounding process unit 10. In other words, the rounding error is:mixed with the (n) bits input signal by the rounding process unit 10.

Figure 6I:
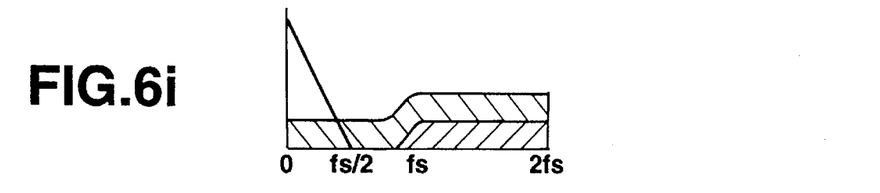
Figure 6J:
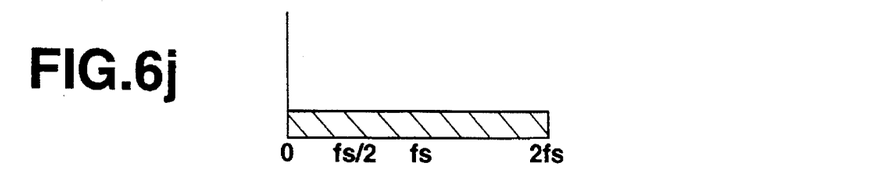
Figure 6K:
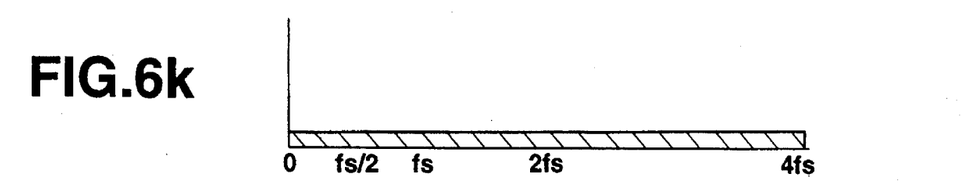
Figure 6L:
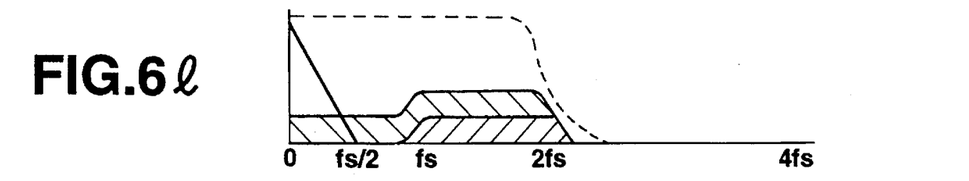
Figure 6M:
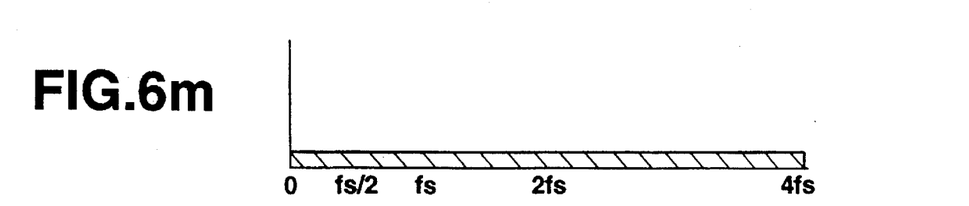

The signal mixed with the rounding error and having the spectrum shown in FIG. 6i is subtracted from the signal having spectrum shown in FIG. 6h by the subtracter 11. As a result, the original signal having the spectrum of (0) to (fs/2) is canceled, and the rounding error shown in FIG. 6j is outputted. The signal having the spectrum shown in FIG. 6j is opposite in phase to the output signal from the rounding process unit 10. The rounding error in FIG. 6j is supplied to the interpolator 12. The rounding error is converted from the sampling frequency to (8fs) and the amplitude to a half amplitude and becomes the signal having the spectrum shown in FIG. 6k. The output signal from the interpolator 12 is supplied to the delay circuit 13 and delayed to match the process of the FIR filter 14. In other words, the output signal from the interpolator 12 is controlled in its output timing to match the output timing of the output signal from the FIR filter 14. Consequently, the output signal from the interpolator 12 is converted to the signal having the spectrum shown in FIG. 6m. FIGS. 6k and 6m respectively show the output signal from the subtracter 11 interpolated and thereafter delayed.

The signal having the spectrum shown in FIG. 6m is then corrected by the multiplier 16 so that the electric power of the corrected signal can become equal to that of the rounding error included in the output signal of the FIR filter 14 as the band up to (fs). The corrected signal is supplied to the adder 15.

The adder 15 is also supplied the signal having the spectrum shown in FIG. 6i. The input signal having the spectrum shown in FIG. 6i is converted from the sampling frequency (4fs) into (8fs) and is oversampled. As a result, the signal having the spectrum shown in FIG. 6l is obtained. The adder 15 substantially subtracts the output signal from the multiplier 16 from the signal having the spectrum shown in FIG. 6l. Since the signal according to the rounding error supplied from the multiplier 16 to the adder 15 is opposite in phase due to the subtraction by the subtracter 11 as aforesaid. As a result, the adder outputs the signal having the spectrum shown in FIG. 6n and it is outputted through an output terminal 17.

Figure 6N:
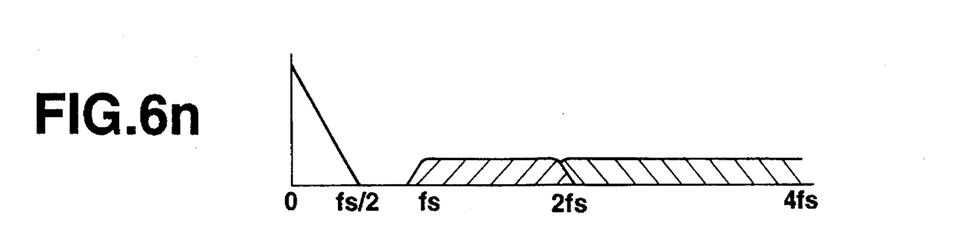

The signal having the spectrum shown in FIG. 6n is not mixes with the rounding error component in the audio frequency band. This signal is only allowed to appear the rounding error around the frequency range (fs) to (4fs) which is out of the audio frequency band.

The explanation is completed of operation by the block 19 to eliminate the rounding error when converting the sampling frequency into (8fs).

As explained above, the embodiment converts the sampling frequency (fs) for the audio signal step-by-step into (8fs) at the input stage of the D/A converter when the digital audio signal is converted into the analog signal in digital audio equipments such as compact disc players and digital audio tape players. The rounding error, in other words the re-quantization error, can be substantially reduced by shifting it out of the audio frequency band.

While the invention has been described in conjunction with specific embodiments, it is evident that many alternatives, modifications, permutations and variations will become apparent to those skilled in the art in light of the foregoing description. For example, the invention can be applicable to the apparatus for operating a digital signal in which the sampling frequency is converted into a higher order to perform the oversampling. Accordingly, it is intended that the present invention embrace all such alternatives, modification and variations as fall within the scope of the appended claims.

What is claimed is:

1. A method for processing a digital signal comprising the steps of:

rounding a filter output signal of a first digital filter to (m) bits from an (n) bit input signal, where (n) bits is longer that (m) bits, thereby providing a mixed signal having a rounding error;

supplying said mixed signal with said rounding error to a second digital filter having (m) bits for an allowed input word length;

generating a rounding error signal opposite in phase to said mixed signal by subtracting said mixed signal with said rounding error from said (n) bits input signal;

compensating amplitude and phase of said rounding error signal in accordance with a process performed by said second digital filter; and adding said compensated signal and a filter output signal of said second digital filter so as to generate an output signal.

2. An apparatus for processing a digital signals wherein a plurality of units are connected in series, each of said units comprising:

a digital filter with an allowable word length of (m) bits as an input signal;

rounding means by which a word length of (n) bits as its input is rounded to said (m) bits as its output for application as the input signal to said digital filter, said word length of (n) bits being longer than said (m) bits;

rounding error detecting means for extracting a rounding error based on the input signals and the output signal of said rounding means; and rounding error eliminating means for eliminating said rounding error contained in an output signal of said digital filter due to the rounded input signal by utilizing said extracted rounding error.

3. An apparatus for processing a digital signal comprising:

a digital filter for converting a sampling frequency via an interpolation function with an allowable word length of (m) bits as an input signal;

rounding means by which a word length of (n) bits as its input is rounded to said (m) bits as its output for application as the input signal to said digital filter, said word length of (n) bits being longer than said (m) bits;

rounding error detecting means for extracting a rounding error based on the input signal and the output signal of said rounding means; and rounding error eliminating means for eliminating said rounding error contained in an output signal of said digital filter due to the rounded input signal by utilizing said extracted rounding error.

4. An apparatus having an input stage for processing a digital signal comprising:

a first digital filter with an allowable word length of (m) bits as an input signal;

a second digital filter connected to the input stage, said second digital filter arranged to output a word length of (n) bits;

rounding means by which the word length of (n) bits as its input is rounded to said (m) bits as its output for application as the input signal to said first digital filter, said word length of (n) bits being longer than said (m) bits;

rounding error detecting means for extracting a rounding error based on the input signal and the output signal of said rounding means; and rounding error eliminating means for eliminating said rounding error contained in an output signal of said digital filter due to the rounded input signal by utilizing said extracted rounding error.

5. An apparatus for processing a digital signal comprising:

a finite impulse response (FIR) digital filter with an allowable word length of (m) bits as an input signal;

rounding means by which a word length of (n) bits as its input is rounded to said (m) bits as its output for application as the input signal to said digital filter, said word length of (n) bits being longer than said (m) bits;

rounding error detecting means for extracting a rounding error based on the input signal and the output signal of said rounding means; and rounding error eliminating means for eliminating said rounding error contained in an output signal of said digital filter due to the rounded input signal by utilizing said extracted rounding error.

6. An apparatus for processing a digital signal according to claim 5, wherein said FIR filter has a filtering characteristics of linear phase response.

7. An apparatus for processing a digital signal comprising:

a first signal processing block and a second signal processing block;

said first signal processing block comprising:

a first digital filter having an allowable input word length of (m) bits;

first rounding means for rounding a word length of (n) bits at its input to (m) bits at its output, (n) bits being longer than said (m) bits, an output signal of said first rounding means containing a rounding error and being applied to the input of said first digital filter;

first rounding error detecting means for extracting said rounding error from said output signal of said first rounding means; and first rounding error eliminating means for eliminating said rounding error from which has been mixed with an output signal of said first digital filter, based on said extracted rounding error;

said second signal processing block serially connected to said first signal processing block comprising;

a second digital filter having an allowable input word length of (m) bits;

second rounding process means for rounding a word length of (n) bits at its input to (m) bits at its output, (n) bits being longer than said (m) bits, an output signal of said second rounding means containing a rounding error and being applied to the input of said second digital filter;

second rounding error detecting means for extracting said rounding error from said output signal of said second rounding means; and second rounding error eliminating means for eliminating mid rounding error, which has been mixed with an output signal of said second digital filter, based on said extracted rounding error;

wherein the output signal from said first rounding error eliminating means is supplied to said second rounding process means.

8. An apparatus for processing a digital signal according to claim 7, wherein said first and second digital filters are FIR filters.

9. An apparatus for processing a digital signal according to claim 8, wherein said FIR filters have filtering characteristics of the linear phase response.

10. An apparatus for processing a digital signal according to claim 7, wherein said apparatus further comprises a further digital filter connected at the input of said first rounding means, which outputs a word length of (n) bits.

11. An apparatus for processing a digital signal according to claim 10, wherein said further digital filter is a FIR filter.

12. An apparatus for processing a digital signal according to claim 11, wherein said FIR filter has a filtering characteristics of linear phase response.

* * * * *